(12) United States Patent
Maki et al.

(10) Patent No.: US 7,489,538 B2
(45) Date of Patent: Feb. 10, 2009

(54) RADIATION TOLERANT COMBINATIONAL LOGIC CELL

(75) Inventors: Gary R. Maki, Post Falls, ID (US); Jody W. Gambles, Post Falls, ID (US); Sterling Whitaker, Albuquerque, NM (US)

(73) Assignee: University of Idaho, Moscow, ID (US)

( * ) Notice: Subject to any disclaimer, the term of this patent is extended or adjusted under 35 U.S.C. 154(b) by 263 days.

(21) Appl. No.: 11/527,375

(22) Filed: Sep. 25, 2006

(65) Prior Publication Data
US 2007/0109865 A1 May 17, 2007

Related U.S. Application Data

(60) Provisional application No. 60/736,979, filed on Nov. 14, 2005.

(51) Int. Cl.
*G11C 7/00* (2006.01)
(52) U.S. Cl. .................. 365/154; 365/189.05
(58) Field of Classification Search ............... 365/154, 365/189.05; 327/200, 208
See application file for complete search history.

(56) References Cited

U.S. PATENT DOCUMENTS

| | | | | |
|---|---|---|---|---|
| 4,454,589 A | 6/1984 | Miller | ........... | 364/716 |
| 4,783,778 A | 11/1988 | Finch et al. | ........... | 370/60 |
| 4,787,057 A | 11/1988 | Hammond | ........... | 364/754 |
| 4,888,774 A | 12/1989 | Kosuge et al. | ........... | 371/38.1 |
| 5,111,429 A | 5/1992 | Whitaker | ........... | 365/156 |
| 5,278,781 A | 1/1994 | Aono et al. | ........... | 364/736 |
| 5,398,322 A | 3/1995 | Marwood | ........... | 395/400 |
| 5,406,513 A * | 4/1995 | Canaris et al. | ........... | 365/181 |

(Continued)

OTHER PUBLICATIONS

"Ionizing Radiation Effects in MOS Devices and Circuits", Edited by T.P. Ma., Department of Electrical Engineering, Yale University, New Haven Connecticut and Paul V. Dressendorfer, Sandia National Laboratories, Albuquerque, NM, A Wiley-Interscience Publication, John Wiley & Sons, pp. 484-589.

(Continued)

*Primary Examiner*—Vu A Le
(74) *Attorney, Agent, or Firm*—Haverstock & Owens LLP

(57) ABSTRACT

A system has a reduced sensitivity to Single Event Upset and/or Single Event Transient(s) compared to traditional logic devices. In a particular embodiment, the system includes an input, a logic block, a bias stage, a state machine, and an output. The logic block is coupled to the input. The logic block is for implementing a logic function, receiving a data set via the input, and generating a result f by applying the data set to the logic function. The bias stage is coupled to the logic block. The bias stage is for receiving the result from the logic block and presenting it to the state machine. The state machine is coupled to the bias stage. The state machine is for receiving, via the bias stage, the result generated by the logic block. The state machine is configured to retain a state value for the system. The state value is typically based on the result generated by the logic block. The output is coupled to the state machine. The output is for providing the value stored by the state machine. Some embodiments of the invention produce dual rail outputs Q and Q'. The logic block typically contains combinational logic and is similar, in size and transistor configuration, to a conventional CMOS combinational logic design. However, only a very small portion of the circuits of these embodiments, is sensitive to Single Event Upset and/or Single Event Transients.

32 Claims, 9 Drawing Sheets

U.S. PATENT DOCUMENTS

| | | | |
|---|---|---|---|
| 5,673,407 A | 9/1997 | Poland et al. | 395/375 |
| 5,867,414 A | 2/1999 | Kao | 364/754.02 |
| 6,326,809 B1 | 12/2001 | Gambles et al. | 326/46 |
| 6,487,134 B2 * | 11/2002 | Thoma et al. | 365/205 |
| 6,573,773 B2 | 6/2003 | Maki et al. | 327/200 |
| 6,583,470 B1 * | 6/2003 | Maki et al. | 257/349 |
| 6,597,745 B1 | 7/2003 | Dowling | 375/296 |
| 6,696,873 B2 | 2/2004 | Hazucha et al. | 327/203 |
| 6,725,411 B1 | 4/2004 | Gerlach et al. | 714/755 |
| 6,757,122 B1 | 6/2004 | Kuznetsov et al. | 360/53 |
| 6,826,090 B1 | 11/2004 | Chu et al. | 365/189.05 |
| 6,826,778 B2 | 11/2004 | Bopardikar et al. | 725/145 |
| 6,895,547 B2 | 5/2005 | Eleftheriou et al. | 714/801 |
| 6,928,602 B2 | 8/2005 | Yamagishi et al. | 714/781 |
| 7,069,492 B2 | 6/2006 | Piret | 714/762 |
| 7,111,221 B2 | 9/2006 | Birru et al. | 714/755 |
| 7,127,653 B1 | 10/2006 | Gorshe | 714/746 |
| 7,162,684 B2 | 1/2007 | Hocevar | 714/800 |

OTHER PUBLICATIONS

"Test Results for SEU and SEL Immune Memory Circuits", D. Wiseman et al., 5th NASA Symposium on VLSI Design 1993, Nasa Space Engineering Research Center for VLSI System Design, University of New Mexico, 2650 Yale Suite # 101, Albuquerque, New Mexico 87106, pp. 2.6.1-2.6.10.

"Low Power SEU Immune CMOS Memory Circuits", IEEE Transactions on Nuclear Science, vol. 39, No. 6, Dec. 1992, M. Norley Liu and Sterling Whitaker, NASA Space Engineering Research Center for VLSI System Design, University of Idaho, Moscow. Idaho 83843, pages.

IAC-02-I.8.08, Radiation Effects and Hardening Techniques for Spacecraft System Microelectronics, Jody Gambles and Gary Maki, Center for Advanced Microelectric & Biomolecular Research, University of Idaho Research Park, 721 Lochsa Street, Suite #8, Post Falls, Idaho 83854 USA, 11 pages.

* cited by examiner

| CD \ AB | 00 | 01 | 11 | 10 |
|---|---|---|---|---|
| 00 | 0 | 1 | 0 | 1 |
| 01 | 1 | 0 | 1 | 0 |
| 11 | 0 | 1 | 0 | 1 |
| 10 | 1 | 0 | 1 | 0 |

Fig. 3

|  y1y2 \ ff' | 00 | 01 | 11 | 10 |
|---|---|---|---|---|
| 00 | 11 | 1X | XX | X1 |
| 01 | Z1 | ZX | 0X | 01 |
| 11 | ZZ | Z0 | 00 | 0Z |
| 10 | 1Z | 10 | X0 | XZ |

Fig. 7 — 700

|  y1y2 \ ff' | 00 | 01 | 11 | 10 |
|---|---|---|---|---|
| 00 | 11 | 1X | - | X1 |
| 01 | Z1 | ZX | - | 01 |
| 11 | ZZ | Z0 | - | 0Z |
| 10 | 1Z | 10 | - | XZ |

Fig. 8 — 800

|  y1y2 \ ff' | 00 | 01 | 11 | 10 |
|---|---|---|---|---|
| 00 | 11 | 10 | - | 01 |
| 01 | Z1 | Z0 | - | 01 |
| 11 | ZZ | Z0 | - | 0Z |
| 10 | 1Z | 10 | - | 0Z |

Fig. 9 — 900

RADIATION TOLERANT COMBINATIONAL LOGIC CELL

RELATED APPLICATIONS

This application claims benefit of priority to U.S. Provisional Patent Application Ser. No. 60/736,979, filed Nov. 14, 2005, and entitled "RADIATION TOLERANT COMBINATIONAL LOGIC CELL," which is incorporated herein in its entirety by reference.

RESEARCH GRANTS

The present invention was developed pursuant to a government contract having NASA grant number NNG04GE96G.

FIELD OF THE INVENTION

The present invention relates to the field of error tolerance. More particularly, the present invention relates to radiation tolerant combinational logic circuits including cells.

BACKGROUND

Effects of Radiation upon Electronics

As is known in the art, the outer space environment contains a number of high energy protons, electrons, and heavy ions. Some of these protons, electrons, and particles are trapped in the Van Allen belt that surrounds the Earth. Similarly, high energy particles are known to be located near objects in outer and deep space, such as planets, stars, moons, and other naturally occurring satellites. As high energy particles from these various sources strike materials, the high energy particles cause direct ionization of the struck material. Unfortunately, the struck material includes man-made orbiting satellites, deep space probes, space stations, shuttles, other space craft and the like, collectively referred to herein as simply "satellites." These satellites are further known to contain a multitude of electronic devices, circuits, and on board computer and/or telecommunications equipment.

A source of incident radiation in terrestrial environments is high-energy particles generated from the interaction of cosmic rays with the atmosphere. These particles are not always generated by direct ionization but are typically indirectly generated as by-products of the high energy particles mentioned above. Also known in the art, the high energy particles can further have silicon ionizing effects. Moreover, decay of radioactive impurities in silicon and alpha particles generated from packaging are yet more sources of silicon ionization.

Accordingly, the semiconductor components of electronic circuitry are often exposed to ionized or charged particles. As mentioned above, the energy level of some charged particles is high. If the energy level of a charged particle is high enough, the particle can penetrate through to the packaging and shielding of a typical electronic circuit, to strike the components of the circuit, and/or to cause direct ionization of the semiconductor components of the circuit. This phenomenon is known in the literature as a Single Event Upset (SEU) of the electronic circuit. Single Event Upset has been studied by the research community. For example, see T. Ma and P. Dressendorfer, IONIZING RADIATION EFFECTS IN MOS DEVICES & CIRCUITS CH. 9, New York, N.Y., John Wiley & Sons, 1989. See also, J. Gambles and G. Maki, *Radiation Effects and Hardening Techniques for Spacecraft System Microelectronics*, IAF World Space Congress, Reference IAC-02-I.05.08. October 2002, which is incorporated herein by reference.

Further, if a high energy charged particle passes through a semiconductor diffusion region of an electronic device, such as a transistor, particularly at a susceptible node within the electronic circuit, then the particle can undesirably alter the contents of data stored within the electronic circuit. A particularly susceptible node within electronic circuits is a logic cell. The logic cell includes, for example, a metal oxide semiconductor (MOS) logic cell. Logic cells use data in the form of binary logic (as a 1 or a 0).

SUMMARY OF THE INVENTION

A Single Event Upset (SEU) undesirably alters a data state in a logical cell. Moreover, in traditional combinational logic, a Single Event Transient (SET) propagates through the logic, which undesirably produces an erroneous output. For binary data, the erroneous output typically is in the form of a false 0 or a false 1. Upsets can be separate, multiple and/or interrelated events. These events and their various combinations will be collectively referred to herein simply as SEU.

In some embodiments of the invention, a system has a reduced sensitivity to SEU compared to traditional logic devices. In a particular embodiment, the system includes an input, a logic block, a bias stage, a state machine, and an output. The logic block is coupled to receive the input. The logic block is for implementing a logic function, receiving a data set via the input, and generating a result f by applying the data set to the logic function. The bias stage is coupled to the logic block. The bias stage is for receiving the result from the logic block and presenting it to the state machine. The state machine is coupled to the bias stage. The state machine is for receiving, via the bias stage, the result generated by the logic block. The state machine is configured to retain a state value for the system. The state value is typically based on the result generated by the logic block. The output is coupled to the state machine. The output is for providing the value of the state machine.

Logic Block

The logic block typically contains combinational logic and is similar, in size and transistor configuration, to a conventional CMOS combinational logic design. Typically, the logic block is defined by an input specification, such as, for example, a truth table or a Karnaugh map. The logic block further provides a complement f' of the result f. These logic block implementations preferably include a redundant set of devices to generate the complement f' of the result f. The redundant set of devices of some embodiments generates the complement f' by receiving the complement of the input data set. In some embodiments, the logic block comprises NMOS devices only, such that a Single Event Upset cannot produce a false 1, while the logic block of an alternative embodiment consists of PMOS devices only, such that a Single Event Upset cannot produce a false 0.

Bias Stage

Some embodiments employ a bias stage to transfer the result of the logic block to the state machine. The bias stage is so named because it is optionally implemented by using a pull down or a pull up network of transistor devices. The pull down network is typically formed by coupling the source leads of a pair of NMOS devices to a level low voltage rail Vss, and coupling the drain leads of the NMOS devices to the state machine. Specifically, the state machine of some embodiments includes a pair of cross coupled PMOS transistors, and thus, in these embodiments, the drain leads of the bias stage NMOS devices are typically coupled to the drain leads of the state machine PMOS transistors.

Alternatively, the pull up network is formed by coupling the source leads of a pair of PMOS devices to a level high voltage rail Vdd, and coupling the drain leads of the PMOS devices to the state machine. In these embodiments, the state machine typically includes a pair of cross coupled NMOS transistors, and thus, the drain leads of the bias stage PMOS devices are coupled to the drain leads of the state machine NMOS transistors.

State Machine

When the state machine is formed by a pair of cross coupled PMOS devices, the source leads of the PMOS devices are coupled to a level high voltage rail Vdd, and the drain leads are coupled to the bias stage, as described above. Conversely, when the state machine is formed by a pair of cross coupled NMOS devices, the source leads of the NMOS devices are coupled to a level low voltage rail Vss, and the drain leads of the NMOS devices are coupled to the bias stage, as described above.

In an alternative embodiment, the state machine has two pairs of PMOS devices that provide full strength P-type channels, such that an action of the state machine in response to the logic block is accelerated.

The state machine advantageously retains the state value for the system during a variety of conditions, such as, for example, during a Single Event Upset condition, or when a node of the state machine has a high impedance. Moreover, the state machine has a reduced area that is susceptible to Single Event Upset. More specifically, the state machine of some implementations includes a pair of storage nodes Y1 and Y2. The system of these implementations tolerates Single Event Upset to the state machine nodes Y1 or Y2.

In some embodiments, the state machine includes first and second nodes. The first node has a stored value and the second node has a complement of the stored value. The first and second nodes are physically separated such that a single particle strike of the system affects only one of the stored value and the complement value. In these embodiments, the particle strike may cause a Single Event Upset, however, the system advantageously tolerates and/or compensates for such an event. For instance, when the particle strikes the logic block of some embodiments, the SEU does not propagate out of the logic block, and the system of these embodiments continues to produce a correct output.

Output

Preferably, the output of the system is buffered. Also preferably, the output has a pair of redundant values Q and its complement Q'. Hence, due to the design of the system, a Single Event Transient propagates to only one of the redundant values Q and Q'. The redundant values Q and Q', of some embodiments, are redundantly coupled to a single input for a memory cell, such that the memory cell is insulated from Single Event Upset by the system. The memory cell of these embodiments is typically also fault tolerant.

Advantages

In operation, the system of various embodiments tolerates a variety of SEU, SET, and combinations thereof. For instance, the system tolerates a first Single Event Upset within the logic block and a second Single Event Upset within the state machine. The system further tolerates multiple upsets within the logic block. The system additionally tolerates multiple upsets within the logic block and one SEU event within the state machine. In some of these embodiments, the system has one or more SEU and/or SET sensitive nodes. These sensitive nodes are preferably separated within the system such that a single particle strike affects no more than one of the sensitive nodes at a time. In the embodiments that produce dual rail outputs Q and Q', only a very small portion of the circuits of these embodiments, is sensitive to Single Event Upset and/or Single Event Transients.

Additionally, a method provides error tolerance for a system. The method implements a logic function. The method receives a data set, generates a result f by applying the data set to the logic function, and presents the result to a state machine. The method stores a state value for the system by using the state machine. The state value is based on the result. The method provides, by using the state machine, a stable state. When the stored state value is different than the stable state, the state machine further transitions to a next state selected from a set of predetermined states.

BRIEF DESCRIPTION OF THE DRAWINGS

The novel features of the invention are set forth in the appended claims. However, for purpose of explanation, several embodiments of the invention are set forth in the following figures.

FIG. 3 illustrates a design for an exemplary logic block that implements a four input exclusive-OR.

FIG. 7 illustrates a state table for the nodes (Y1 and Y2) of the state machine in the exemplary system of FIG. 6.

FIG. 8 illustrates a simplified state table simplified by using only NMOS transistors for the exclusive-OR logic block implementation of FIGS. 4, 5 and 6.

FIG. 9 illustrates a state table, which is the state table of FIG. 8 with the conflicts resolved.

DETAILED DESCRIPTION

Figure 1:
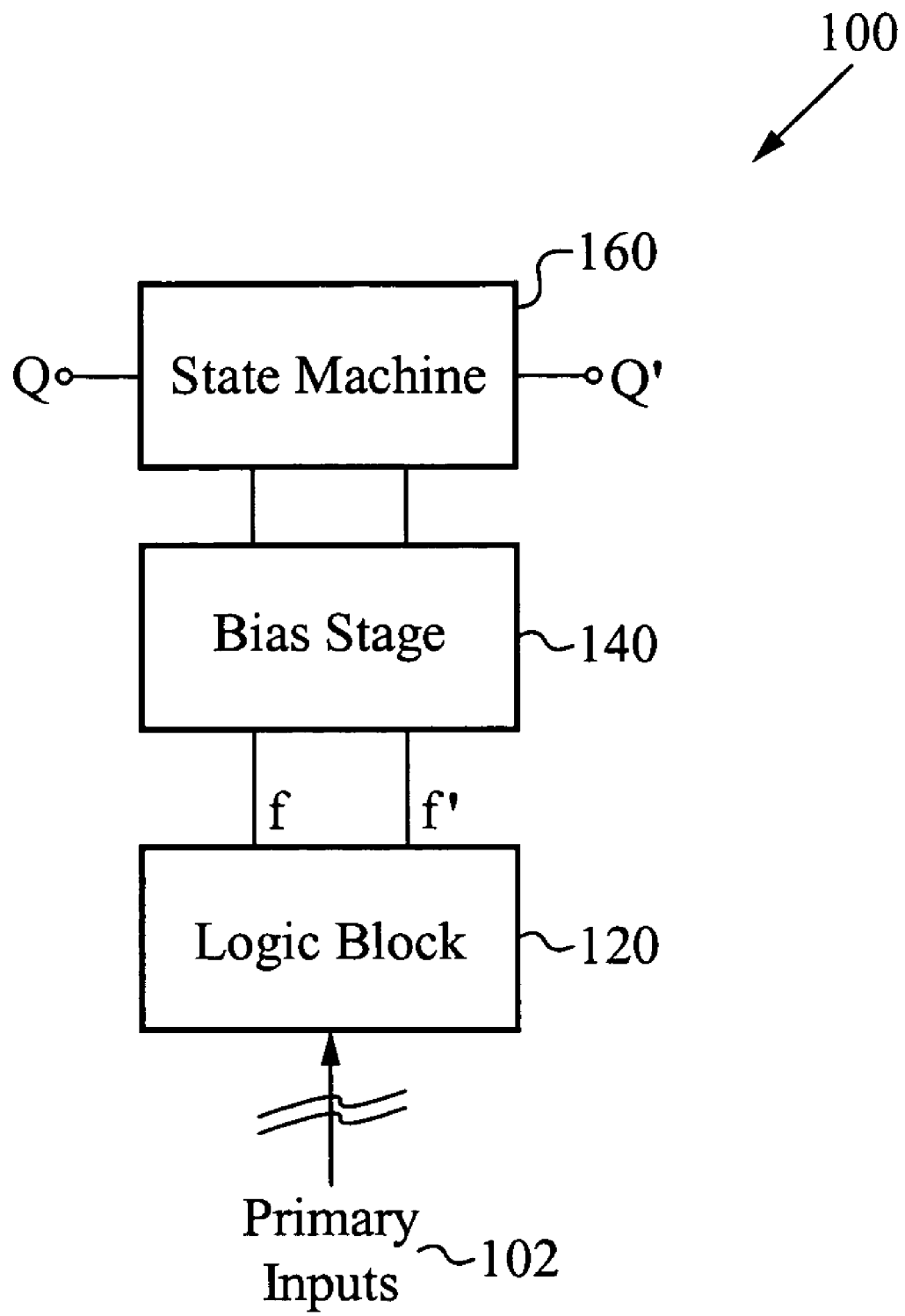
FIG. 1 illustrates a Single Event Upset tolerant system in accordance with some embodiments of the invention.

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail.

I. Introduction

In an embodiment of the invention, a combinational logic device (or system) has a greatly reduced Single Event Upset and/or Single Event Transient sensitive region when compared to traditional combinational logic designs. In traditional combinational logic devices, a Single Event Upset and/or a Single Event Transient undesirably propagates through the logic devices to produce a false output value. Some embodiments of the invention include a combinational logic block and a pass transistor network that use only one type of transistor device. These embodiments reduce the types of false output errors that are possible. For instance, some embodiments employ only NMOS type transistors. These transistors are coupled with a state machine for retaining a state of the system. Further, some embodiments produce dual rail outputs (both Q and Q') for redundancy and improved error resilience.

Despite their SEU tolerance, the combinational logic portion of these embodiments is similar in transistor configuration, and is typically no larger in size, then a conventional CMOS combinational logic design. Thus, the system of these embodiments is manufactured by using conventional techniques. However, only a very small portion of the circuits of these embodiments is vulnerable to SEU and/or SET(s).

II. Radiation Tolerant Electronics

The design of Radiation Tolerant (RT) electronics is encouraged through a new national program entitled Radiation Hardness By Design (RHBD). The Radiation Hardness By Design program focuses on techniques to yield hardened devices that can be fabricated in standard commercial fabrication processes. Some embodiments of the invention provide a novel radiation tolerant combinational logic device and/or system in promotion of the Radiation Hardness By Design program.

The current trend in electronic circuit design is the use of reduced power consumption components and architectures. However, operating CMOS circuits at low voltage increases susceptibility to soft errors that occur when ambient energetic particles strike the junctions of a semiconductor device. For instance, alpha particles have been shown to produce Single Event Upset in microelectronic devices at ground level just as do galactic cosmic rays and solar particles in the natural space environment. See J. L. Barth, *Natural Radiation Environment Definition for Electronic System Design,* In Digest of Papers of the 2002 Government Microcircuits Applications and Critical Technologies Conference, pp. 212-215, Monterey, Calif., March 2002. See also, D. Wiseman, D., J. Canaris, S. Whitaker, J. Gambles, K. Arave, and L. Arave, *Test Results for SEU and SEL Immune Memory Circuits,* In Proceedings of the 5th NASA Symposium on VLSI Design, pp. 2.6.1-2.6.10, Albuquerque, N.M., November 1993 (hereinafter the "Test Results" paper, which is incorporate herein by reference).

RHBD circuit technology developed by the inventors named within the present patent application has been shown to be effective in producing space flight microelectronic devices in 5.0, 3.3, 2.5, and 0.5 volt CMOS technologies. See, for example, the *Test Results* paper, incorporated by reference above; K. J. Hass, *SEE Test of RT50 Radiation-Tolerant Library (0.5 m) and 0.35 m Variant,* Microelectronics Research Center Test Report, University of New Mexico, Dec. 10, 1998; U.S. Pat. No. 6,573,773, entitled "Conflict Free Radiation Tolerant Storage Cell," issued Jun. 3, 2003 to G. K. Maki, K. J. Hass, Q. Shi, and J. Murguia; which is incorporated herein by reference; U.S. Pat. No. 5,111,429, entitled "Single Event Upset Hardening CMOS Memory Circuit," issued May 5, 1992 to S. Whitaker; which is incorporated herein by reference; U.S. Pat. No. 6,326,809, entitled "Apparatus For And Method Of Eliminating Single Event Upsets In Combinational Logic," issued Dec. 4, 2001 to J. W. Gambles, K. J. Hass, and K. B. Cameron, which is incorporated herein by reference; U.S. Pat. No. 5,406,513, entitled "Mechanism For Preventing Radiation Induced Latch-up In CMOS Integrated Circuits," issued May 11, 1995 to J. Canaris, S. Whitaker, and K. Cameron, which is incorporated herein by reference; U.S. Pat. No. 6,583,470, entitled "Radiation Tolerant Back Biased CMOS VLSI," issued Jun. 24, 2003, to G. Maki, J. Gambles and K. Hass, which is incorporated herein by reference; M. Liu and S. Whitaker, *Low Power SEU Immune CMOS Memory Circuits,* IEEE Transactions on Nuclear Science, NS-39(6):1679-84, December 1992, which is also incorporated herein by reference.

Some of the research findings in the patents and publications cited above yield the following determinations: The consequences of a Single Event Upset upon an electronic system often depend on:

(1) the function of a logic cell within the affected circuit of the system, (2) a recovery time for the affected circuit of the system, (3) SEU immunity of the circuit/system, and (4) a timing of the SEU event.

In view of the foregoing, there are three fundamental concepts that are preferably implemented to design SEU immune circuitry. First, information must be stored in (multiple) different places or presented from more than one independent source. This redundancy provides error resilience and maintains a source of uncorrupted data during and/or after an SEU. Second, an external (or internal) signal from the non-corrupted source must cause the lost data to recover after a particle strike. Third, electric current induced by a particle hit flows from the N-type diffusion to the P-type diffusion of P-N junction type semiconductor devices. Hence, if a single type of transistor is used to store digital data, then data upset only occurs in a single direction across the P-N junction. For instance, PMOS type devices used to store a "1" cannot be upset from a "1" to a "0." Conversely, NMOS type devices used to store a "0" cannot be upset from a "0" to "1." Stated differently, an NMOS device cannot produce a "false 1", and a PMOS device cannot produce a "false 0."

III. Digital Logic and SEU Tolerant Digital Logic

Digital logic circuits are often grouped into two general categories: combinational logic circuits and sequential logic circuits. The output of a combinational logic circuit is defined entirely by the present input. In contrast, the output of a sequential logic circuit is a function of present and past inputs. Normally, sequential circuits have feedback and combinational circuits do not. However, in practice, combinational circuits when implemented in conjunction with weak pull up (or pull down) devices with feedback optionally retain a state. The synthesis of such devices uses combinational logic techniques. An example of such a circuit is a Domino logic circuit.

In accordance with the invention, some embodiments employ combinational logic circuits to achieve Single Event Upset tolerance.

A. Overview of the System

For instance, FIG. 1 illustrates a Single Event Upset tolerant system 100 in accordance with some embodiments of the invention. As shown in this figure, the system 100 includes a logic block 120, a bias stage 140, and a state machine 160.

The logic block 120 typically receives a set of primary inputs 102 and presents the result of its logic determinations to the bias stage 140 through a result node. The result node couples the logic block 120 to the bias stage 140. The result node of some embodiments includes a result f and its complement f'. Hence, the logic block 120 illustrated in FIG. 1 particularly implements a dual rail combinational logic circuit. The logic block 120 is typically defined by a truth table, Karnaugh map, or another input specification.

The bias stage 140 is driven by the logic block 120 and is also coupled to the state machine 160. Hence, the logic block 120 specifies when the bias stage 140 transfers a value of logic "1" or "0," for example, to the state machine 160. The state machine 160 is coupled to an output node that includes the outputs Q and its complement Q'.

As described above, the logic block 120 preferably includes combinational digital logic. In these embodiments, the state machine 160 is used to store the result produced by the logic block 120 for each set of inputs asserted at the primary inputs 102 to the logic block 120. More specifically, the state machine 160 of some embodiments retains the state logic value for the system 100 during an upset, such as a Single Event Upset, or when a line coupling the state machine 160 to the bias stage 140 assumes a high impedance.

B. Specific Implementation of the System

Figure 2:
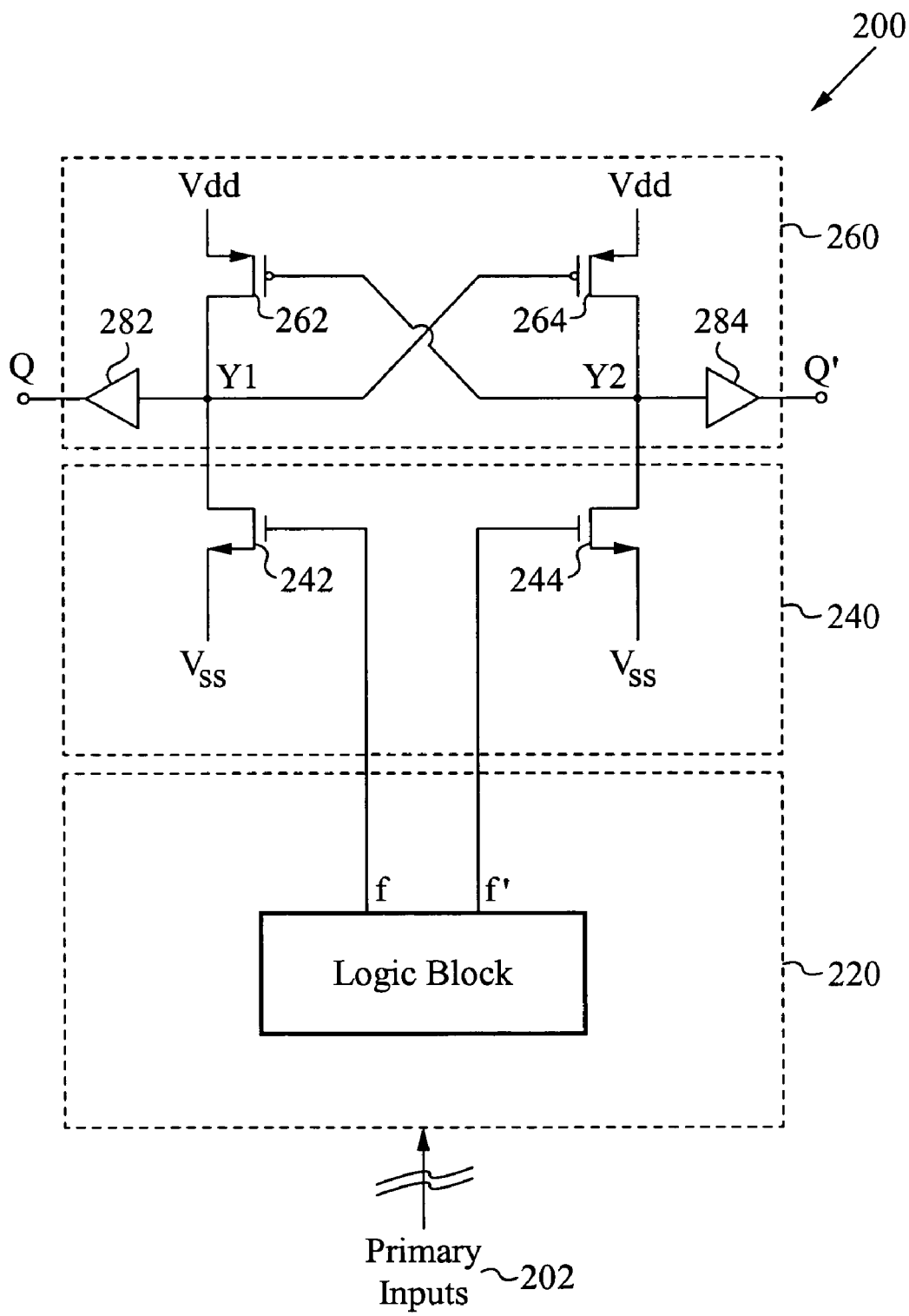
FIG. 2 illustrates the state machine and the bias stage in further detail.

FIG. 2 illustrates the state machine and the bias stage of a particular embodiment in further detail. Specifically, FIG. 2 shows that the bias stage of some embodiments is formed by using a pull down network. As shown in this figure, the SEU tolerant system 200 includes a (combinational) logic block 220, a bias stage 240, and a state machine 260. More specifically shown in this figure, the bias stage 240 includes a "pull down" circuit that is formed by a pair of NMOS transistors 242 and 244 coupled to a level low voltage rail Vss. Vdd can be any conventional value. Vss is typically ground.

The state machine 260 is formed by coupling a pair of cross coupled PMOS transistors 262 and 264 in series with the NMOS transmitters 242 and 244 of the bias stage 240. Specifically, the drain of the PMOS transistor 262 is coupled to the drain of the NMOS transistor 242, while the drain of the PMOS transistor 264 is coupled to the drain of the NMOS transistor 244. The PMOS transistors 262 and 264 are cross coupled in that the gate of one PMOS transistor 262 is coupled to the drain of the other PMOS transistor 264, and the gate of the PMOS transistor 264 is coupled to the drain of the PMOS transistor 262. Through their cross coupling, the PMOS transistors 262 and 264 provide feedback from the state machine 260 to the bias stage 240 of the system 200. The PMOS transistors 262 and 264 of some embodiments are "weak" in comparison to the NMOS transistors 242 and 244 of the bias stage 240.

When activated, the state machine 260 draws power through the PMOS transistors 262 and 264 that are further coupled to a level high voltage rail (Vdd). The level high and low voltage rails (Vdd and Vss) typically specify the high and low values for the system 200. For instance, in some embodiments high and low are interpreted as a logic "1" and "0," respectively. However, one of ordinary skill will recognize the various implementations of high and low values for the system 200.

As similarly described above in relation to FIG. 1, the logic block 220 of FIG. 2 receives data at a primary input 202 and presents its results f and f' to the bias stage 240 through the result nodes, which couple the logic block 220 to the bias stage 240. The bias stage 240, through the NMOS transistors 242 and 244, presents the results (f and f') to the state machine 260. The state machine 260 stores a state for the system 200 at a pair of storage nodes Y1 and Y2 within the state machine 260. The state is based on the presented results f and f'. The values stored at the storage nodes Y1 and Y2 are then available at the outputs Q and Q'.

Specifically, each complementary value f and f' of the result drives the NMOS transistors 242 and 244 that are coupled to the low voltage rail (Vss) in the pull down circuit 240. These NMOS transistors 242 and 244, in turn, present the values on f and f' to the PMOS transistors 262 and 264, which store a state based on these values at the storage nodes Y1 and Y2 in the state machine 260. As mentioned above, the gates and drains of the PMOS transistors 262 and 264 are cross coupled to form the storage nodes Y1 and Y2. The storage nodes Y1 and Y2 provide the two outputs Q and Q' through a pair of buffers 282 and 284. As shown in FIG. 2, the buffers 282 and 284 of some embodiments are formed by using inverters. Hence, the inverters buffer the outputs Q and Q' of the system 200.

For instance, when the result f is high, the NMOS transistor 242 is activated by the result f. The activated NMOS transistor 242 couples the storage node Y1 to the low rail Vss. Accordingly, the storage node Y1 assumes the voltage on the low rail Vss, and the output Q also has this low value. Typically, in the absence of an upset condition, the complement result f' is low, when the result f is high. Hence, the NMOS transistor 244 is deactivated by the low result f' signal on its gate input. Moreover, the low voltage value (from Vss) stored at the storage node Y1 is asserted onto the gate input of the cross coupled PMOS transistor 264, which activates this transistor 264. The activated PMOS transistor 264 couples the high rail Vdd to the storage node Y2 and the output Q'. Accordingly, the storage node Y2 assumes the voltage on the high rail (Vdd), which is also available at the output Q'.

As mentioned above, in some embodiments each PMOS transistor 262 and 264 in the state machine 260 is weak relative to the NMOS transistors 242 and 244 in the pull down circuit 240 such that when both of a coupled pair of N and P type transistors are activated, the NMOS device 242 or 244 will prevail over the coupled PMOS device 262 or 264, and drive the corresponding storage node Y1 or Y2, respectively, to "0."

In view of the foregoing, the system of some embodiments implements a SEU tolerant memory cell having outputs Q and Q'. Additionally, the logic block of different embodiments is designed to implement a variety of different functions that use NMOS pass transistors in combinational digital logic.

Some embodiments include an alternative circuit to the circuit 200 illustrated in FIG. 2. In the alternative circuit, the (combinational) logic block includes a set of PMOS only devices, a "pull up" network in a bias stage, and a state machine. The pull up network is formed by coupling a pair of PMOS transistors to a high input rail Vdd. The state machine has a pair of (weak) NMOS devices coupled to the PMOS transistors in the "pull up" bias stage. These embodiments that employ PMOS logic devices are further described below in relation to FIG. 11.

IV. SEU Tolerant Logic Analysis

A. State Equations

The circuit 200 of FIG. 2 (or the circuit 1100 of FIG. 11 that uses PMOS devices) is analyzed by using a technique described in the Test Results paper incorporated by reference above, and the U.S. Pat. No. 6,573,773, entitled "Conflict Free Radiation Tolerant Storage Cell," issued Jun. 03, 2003, to G. K. Maki, K. J. Hass, W. Shi, and J. Murguia, which is also incorporated herein by reference.

As described in these publications, Y1 and Y2 are variables that represent a next state of the system 200, while y1 and y2 are variables that represent the present or internal state. The variables y1 and y2 correspond to the nodes Y1 and Y2 illustrated in FIG. 2. As described above, the nodes Y1 and Y2 store the operations of the system 200 for the set of primary inputs 202 received by the logic block 220. Also described above, the (combinational) logic block 220 presents its result to the bias stage 240 through the result nodes having f and f', and, in turn, to the state machine 260 (and the nodes Y1 and Y2). As described herein, f and f' are considered as independent signals from separate independent sets of supporting logic devices, which are capable of tolerating independent SEU events.

Applying the discussion of the logic circuits within the U.S. Pat. No. 6,573,773, and the Test Results paper referenced above, yields:

$$Y1 = y2'(1) + f(0)$$

$$Y2 = y1'(1) + f(0)$$

These equations are further stated as:
The next state variable Y1 is driven to a logic 1 when the internal state variable y2=0; OR
The next state variable Y1 is driven to a logic 0 when the logic block result signal f=1.

Yet another way of stating the above is:
Y1 assumes the Vdd value through the weak PMOS transistor (262) when y2=0; OR
Y1 assumes the Vss value through the NMOS transistor (242) when the result signal f=1.

B. Specific X-OR Example for the Logic Block

The logic design for implementing the combinational logic block of some embodiments is based on IEEE publications by S. Whitaker and G. Maki (et al.). See S. Whitaker and G. Maki, *Pass Transistor Asynchronous Sequential Circuits*, IEEE Journal of Solid State Circuits, p. 71-78, February 1989. See also, D. Radkrishnan, S. Whitaker and G. Maki, *Formal Design Procedures for Pass Transistor Switching Circuits*, IEEE Journal of Solid State Circuits, p. 531-36, April 1985.

For instance, FIG. 3 illustrates a Karnaugh map 300 for an exemplary logic block that implements a four input exclusive-OR logic function. As shown in this figure, the four inputs include A, B, C, and D. The Karnaugh map 300 designates each of the sixteen possible results for the various combinations of the four inputs. In the exclusive-OR example, when an even number of the inputs A, B, C, and D are high (have a logic 1), the result f of the exclusive-OR function has a low value (logic 0). Conversely, when an odd number of the four inputs A, B, C, and D are high, the result f is high.

Figure 4:
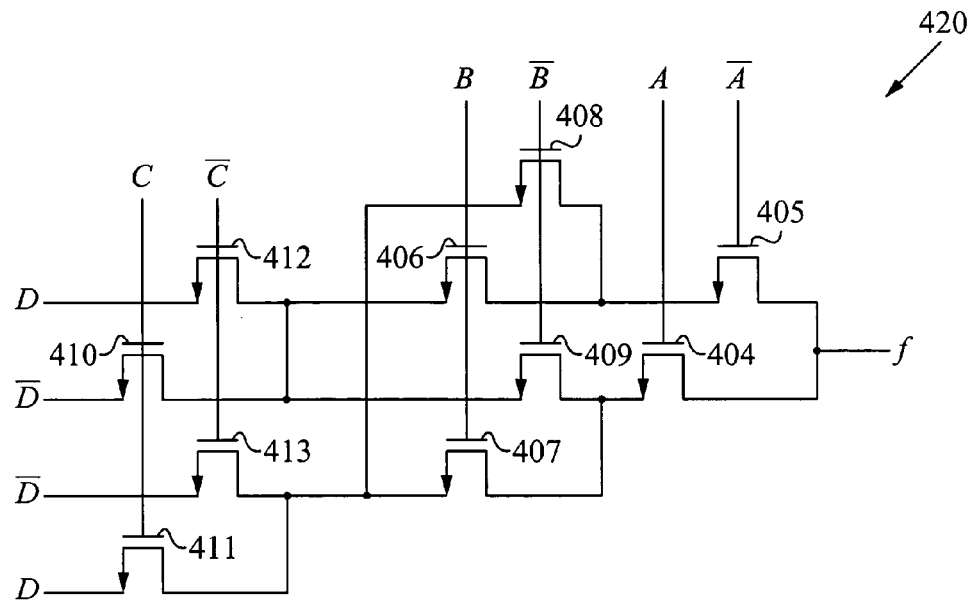
FIG. 4 illustrates the logic block of some embodiments in further detail.

The corresponding circuit 420 that implements the four input exclusive-OR function of FIG. 3 is illustrated in FIG. 4. As shown in this figure, the primary inputs A, B and C are "control" inputs, while the primary input D is a "data" input. Each of the four inputs A, B, C and D of the exclusive-OR function is coupled to one or more NMOS devices 404, 405, 406, 407, 408, 409, 410, 411, 412 and 413, that are coupled to each other in a particular circuit pattern for implementation of an exclusive-OR logic function. Specifically, the input A is coupled to the gate lead of the NMOS device 404, while the complement of the input A (A-bar) is coupled to the gate of the NMOS device 405. The input B is coupled to the gates of the NMOS devices 406 and 407, while its complement (B-bar) is coupled to the NMOS devices 408 and 409. The input C is coupled to the gates of the NMOS devices 410 and 411, while its complement (C-bar) is coupled to the gates of the NMOS devices 412 and 413. The input D is coupled to the source leads of the NMOS devices 411 and 412, while its complement (D-bar) is coupled to the source leads of the NMOS devices 410 and 413.

Figure 5:
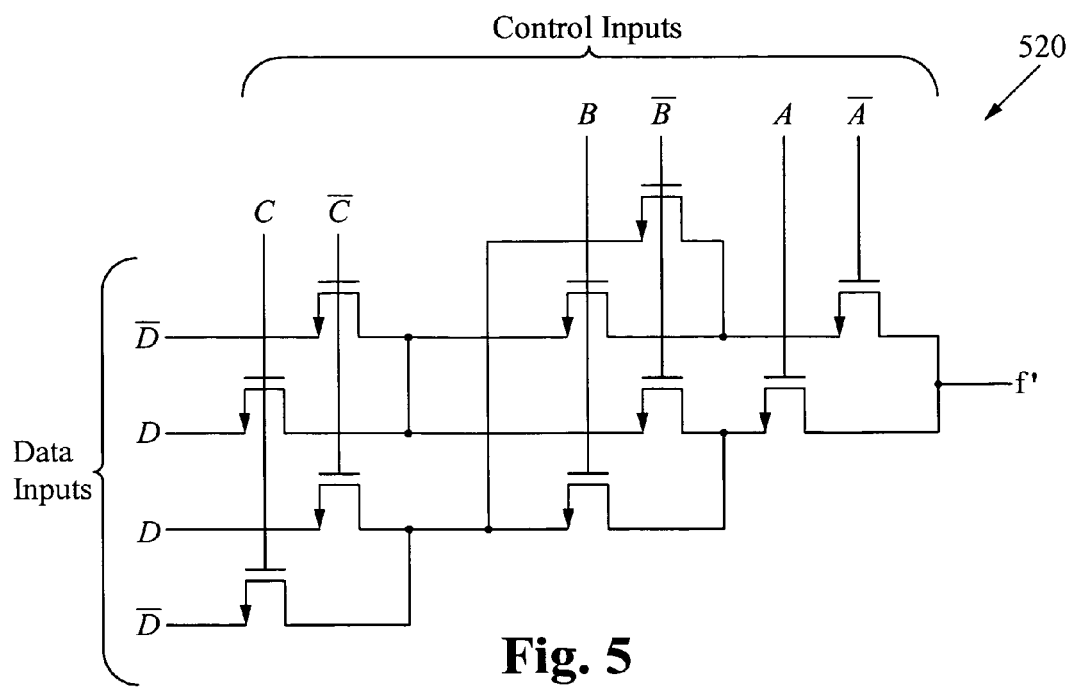
FIG. 5 illustrates that the logic block includes separate devices for providing the complement result f'.

As mentioned above, the logic block of some embodiments provides redundant combinational logic circuitry as part of a robust error resilient (dual rail) architecture. To generate a complemented result f' for a given logic block that implements a function f, some embodiments complement all the data inputs (here, the data input D) of the logic block function f, but not the control inputs (A, B and C, for this example). Such a circuit 520 that provides the complement f' of the logic block X-OR function f (of FIG. 4), is illustrated in FIG. 5. As described above, due to the nature of diffusion within NMOS devices, it is impossible for an SEU event to undesirably alter the result of NMOS logic from a "0" to a "1." Accordingly, no false "1," but only false "0" is possible from an SEU in NMOS only logic. Accordingly, the embodiments illustrated in FIGS. 4 and 5, that employ an NMOS only logic block, need only to account for SEU and/or SET, which result in false 0.

Figure 6:
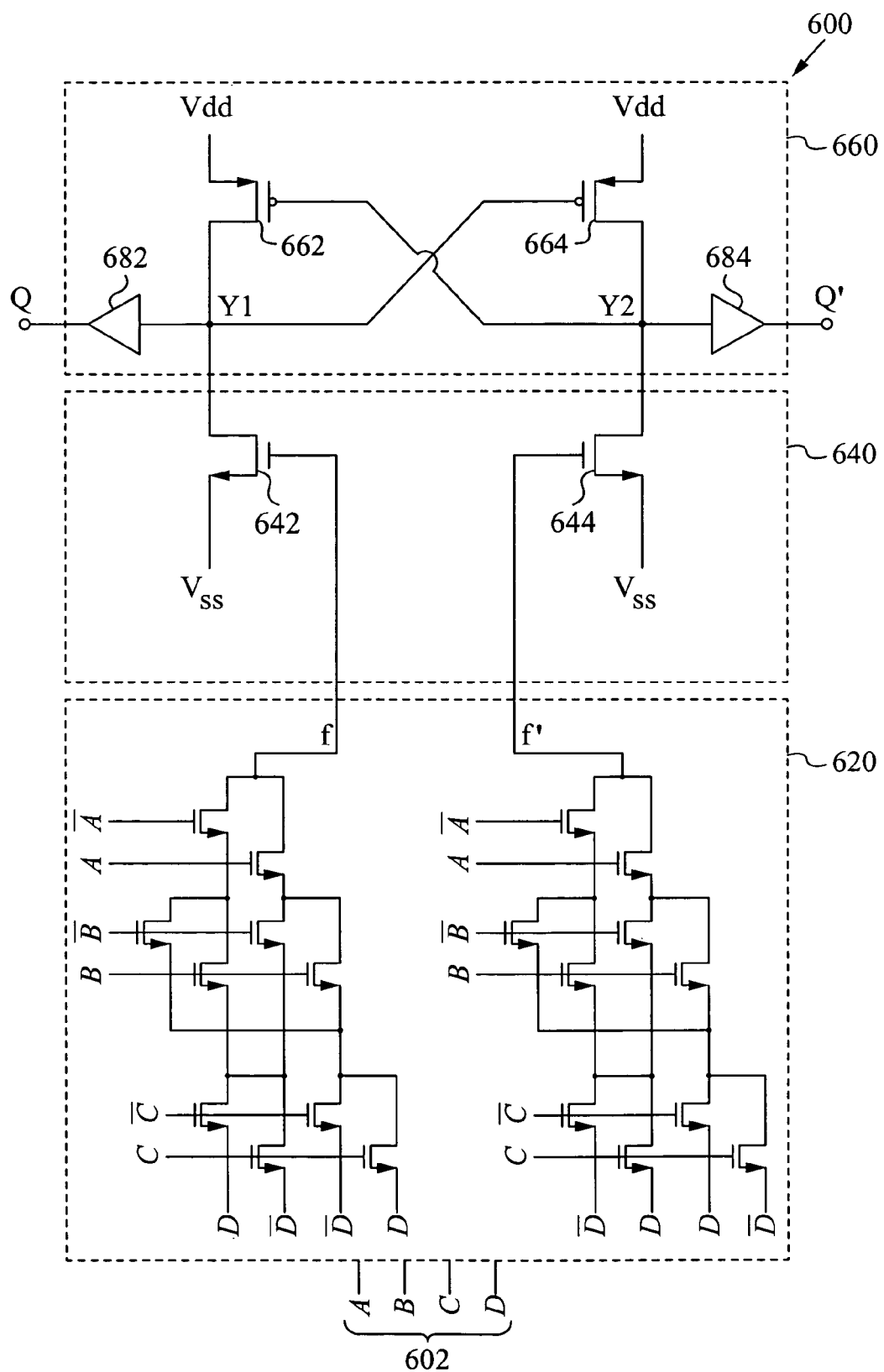
FIG. 6 illustrates the system of FIG. 2 with the exclusive-OR logic block implementation of FIGS. 4 and 5.

FIG. 6 illustrates an exemplary system 600 that combines the features of the embodiments described above. As shown in this figure, the exemplary system 600 includes a state machine 660 and a bias stage 640 as implemented in FIG. 2, and a combinational logic block 620 for an exclusive-OR function as implemented in FIGS. 4 and 5. As further shown in FIG. 6, the system 600 has only NMOS devices in the logic block 620, a pair of NMOS transistors 642 and 644 in the bias stage 640, and a pair of weak cross coupled PMOS transistors 662 and 664 in the state machine 660. As previously described, the cross coupled PMOS transistors 662 and 664, the NMOS transistors 642 and 644, and a pair of outputs Q and Q' are all coupled at the storage nodes Y1 and Y2. The storage nodes Y1 and Y2 typically provide a state for the system 600 of FIG. 6. The states for the system 600 are summarized in a state table.

FIG. 7 illustrates a state table 700 for the nodes (Y1 and Y2) of the state machine 660 of FIG. 6. In FIG. 7 an "X" denotes a conflict for the circuitry of the system 600. A conflict occurs when both of a pair of coupled transistors are activated. For instance, when both the PMOS transistor 662 and the NMOS transistor 642 are activated, a conflict occurs. Similarly, when both the PMOS transistor 664 and the NMOS transistor 644 are activated, a conflict occurs. As described above in relation to FIG. 2, these transistor pairs are coupled by their drains between the high and low voltage rails (Vdd and Vss) of the system 600.

Also shown in FIG. 7, a "Z" denotes a high impedance state for the circuitry of the system 600. High impedance occurs, for example, when both of a coupled pair of the transistors, are deactivated, for example, when both the PMOS transistor 662 and the NMOS transistor 642 are deactivated, or when both the PMOS transistor 664 and the NMOS transistor 644 are deactivated. Particularly, the NMOS transistors 642 and 644, are deactivated through their gate inputs by the result of the logic block 620 through f and f' such that the NMOS transistors 642 and 644 essentially operate as a high impedance resistor.

Thus, the state table 700 of FIG. 7 defines the circuit action for the system 200 of FIG. 2, when its logic block 220 implements an X-OR logic function as more specifically illustrated in FIGS. 4, 5 and 6. As further shown in FIG. 7, the state table 700 has four node conditions, two for the two logic block results f and f', and two for the two state machine internal state nodes Y1 and Y2.

As mentioned above, the system 600 has certain advantages. For instance, the NMOS only implementation of the logic block 620 simplifies the state table 700 for the system 600. FIG. 8 illustrates a state table 800, which is the state table 700 of FIG. 7, simplified by using only NMOS transistors for the logic block. Such an exemplary logic block 420 and 520, is illustrated in FIGS. 4 and 5, and is shown coupled to the system in FIG. 6. As mentioned above in relation to FIGS. 4 and 5, the use of only one type of transistor, in this case NMOS devices, has particular advantages for SEU tolerance. For instance, since charge diffuses in only one direction in a typical NMOS device, the NMOS device will never produce a false 1.

Hence, as shown in FIG. 8, a result (f, f') of (1, 1) is not possible for the exemplary logic block 620 that uses only NMOS type devices. Accordingly, the column of the table 800 corresponding to the result (f, f') of (1, 1) is removed in the FIG. 8.

Moreover, some embodiments employ weak PMOS transistors in the state machine. These weak transistors tend to be secondary to the relatively stronger NMOS transistors in the pull down stage. Since the NMOS transistors in the pull down stage are coupled to the low rail (Vss), each conflict "X" in the state table will resolve to a logical value of "0." For instance, whenever one or more pairs of the PMOS devices 662 and 664, and the coupled NMOS devices 642 and 644, are activated at the same time, the strength of the NMOS device 642 or 644 is typically designed to overcome the (weaker) coupled PMOS device 662 or 664, respectively. Accordingly, the node Y1 and/or Y2, in the state machine 660, assumes (from the low rail Vss) a voltage value that is interpreted as a logic "0". Hence, a "conflict" between the PMOS and NMOS devices (642 and 662, or 644 and 664) is resolved in favor of the NMOS device 642 or 644.

FIG. 9 illustrates a state table 900, which is the state table 800 of FIG. 8 with these conflicts resolved to provide further simplification of the table 800. As shown in FIG. 9, the conflict values "X" are replaced by a logical "0" value to reflect resolution to the low rail voltage (Vss).

As further illustrated by the simplified and resolved state table 900 of FIG. 9, there are two stable states for the system 600 that has an NMOS only logic block 620 implementation of the X-OR logic function. In this example, the "total circuit" stable states (f f' y1 y2), for the system 600, are 0110 and 1001. Thus, the state table 900 defines all circuit action for the X-OR logic block implementation and further demonstrates that the system 600 provides tolerance for all possible Single Event Upset to the vulnerable devices of the system 600.

V. Examples of System Operation and Tolerance

A. SEU Effects on a Single Variable in the System

For instance, when the system 600 resides in the stable state 0110, a Single Event Upset can affect one logic block result, or one state variable in the system 600. Specifically, an SEU undesirably affects the logic block 620 and/or an SET propagates through the logic block 620 to alter the logic block result f or f'. Regardless of the undesirable effect, however, the logic block result is correctly resolved, and the system 600 tolerates the SEU and/or SET. The following describes three of such examples, and an exemplary impossible condition. As described above, because of their particular design, some embodiments are not vulnerable to certain types of error conditions. The system 600 further benefits from foregoing the additional hardware and complexity that is required to resolve impossible conditions.

1. Signal f' assumes a false 0.

If the result f' experiences an SEU and assumes a false 0, then the next total state for the system 600, is 0010. The next state entry in the table 900 is 1Z, which is a stable state, and the system 600 will not transition further. In this condition, the (state variable) node Y2 is in the high impedance state and therefore has no excitation energy to change. Once the SEU event has cleared, f' will return to a value of 1 and the system 600 will transition to the stable state 0110. Since the output is dependent on y1 and y2, which do not change, the output (Q and Q') for the system 600, is unaffected by the SEU of the logic block result f. Therefore no transient is presented on Q or Q'.

2. Signal f assumes a false 1.

Since the logic block circuit (620) that generates f and f' is an NMOS only logic circuit, it is impossible for the NMOS only circuit (620) to produce a false 1.

3. State variable y1 assumes a false 0.

In this case, when the node Y1=false 0, the system 600 transitions to the state 0100, which has a next state entry of 10, in the table 900. While the node Y1=false 0, the next state Y1 is excited to 1. The system 600 will remain in the state 0100 as long as the SEU event holds the node Y1 at false 0, after which time the node Y1 transitions to the correct 1 value and the system is stable in the state 0110 again. The system output Q has a transient. The complement output Q' has no transient.

4. State variable y2 assumes a false 1.

In this case, when the node Y2=false 1, the system 600 transitions to the state 0111, which has a next state entry of Z0, in the table 900. The node Y2 is excited and returns to a correct 0 value. Hence, after the SEU event, the system 600 will return to the stable state 0110. The system output Q has no transient. The complement output Q' has a transient.

Single Variable Summary

In the system operation examples above, no transient value is presented on the output (Q and Q') when an SEU event strikes the logic block, but there is a transient on the output when an SEU event impacts the nodes Y1 or Y2. Normally in a combinational logic circuit, the majority of the logic devices (such as transistors) reside in the logic block. As a result, the area within the circuit that is prone to propagate SEU is reduced to only the outputs Q or Q', to the nodes Y1 or Y2, and to the buffering inverters 682 and 684 (for the outputs Q or Q').

One of ordinary skill will recognize that the discussion above for the stable state 0110 applies for the other stable state 1001, of the exemplary system 600, as well.

B. SEU Events Affecting More than one NMOS Device in the Logic Block

Again, for the case in which the logic block (420, 520, 620) consists of only NMOS devices, no Single Event Upset can induce an NMOS only logic block to produce a false 1. Accordingly, if an SEU event affects more than one NMOS device, the output, in the worst case, is a false 0, and is no different than the case of the single variable change described above. Therefore, in the cases where more than one NMOS device in the logic block is affected, the SEU/SET are tolerated as described above for f and/or f' that have a false 0.

C. SEU Event Affecting Two Variables in the System

Continuing from the discussion above, consider an embodiment of the system 600 that is in the stable state 0110. Again, f cannot assume a false 1 when the combinational logic block 620 consists of only NMOS devices.

1. Signal f' assumes a false 0 and state variable y1 assumes a false 0.

If f' experiences an SEU and assumes a false 0, and y1 assumes a false 0, then the next state is 0000 for the system 600. As shown in the state table 900 of FIG. 9, the next state entry in the table 900 is 11. When the next state is 11, there are two cases to consider:

(a) The SEU event dissipates before the circuitry can respond.

In the case where the SEU dissipates quickly, the circuit transitions to the state 0100, which has a next state entry of 10. The node Y1 is excited to change. Hence, when the SEU event that altered the node Y1 to a false 0 dissipates, the node Y1 will transition to a correct 1 value, and the system 600 returns to the correct (stable) state 0110. In this case, only the output Q has a transient.

(b) The circuitry is faster than the time for the SEU event to dissipate.

In the case where the circuitry is faster than the time for the SEU to dissipate, the node Y2 is excited and the system 600 will transition to the state 0001. The node Y1 is held at false 0, due to the long SEU event (relative to the speed of the circuitry). For the system state 0001, the next state entry in the state table 900 of FIG. 9, is Z1, which is a stable state. Eventually, the SEU event will dissipate and the result f' will return to a correct value of 1. Then, the system 600 will transition to the state 0101, which has a next state entry of Z0, in the table 900. The node Y2 is excited to assume a 0 value, which causes the system 600 to transition to the state 0100. The state 0100 has a next state entry of 10 in the state table 900. The node Y1 is then excited to change, which causes the system 600 to return to the correct (stable) state 0110. In this case, both the outputs Q and Q' have transients but eventually recover to their correct values.

2. Signal f' assumes false 0 and state variable y2 assumes a false 1.

In the case where the result signal f' assumes a false 0, the system 600 transitions to the state 0011, which has a next state entry of ZZ in the state table 900 of FIG. 9. The system 600 remains in this state as long as the SEU event holds the result f' at a "false 0" value. When the result f' returns to the correct value "1," then the system will transition to the state 0111, which has a next state entry of Z0 in the state table 900. The node Y2 is then excited to assume a 0 value, which will restore the correct logic values for the system 600. In this case, only the output Q' has a transient.

3. State variable y1 assumes a false 0 and state variable y2 assumes a false 1.

In the case where y1=false 0, and y2=false 1, the system 600 transitions to the state 0101, which has a next state entry of Z0 in the state table 900 of FIG. 9. The node Y2 is excited to change, and the system 600 transitions to the state 0100, which has a next state entry of 10 in the state table 900. The node Y1 is excited to change, and the system returns to the correct (stable) state 0110. In this case, both the outputs Q and Q' have transients but eventually recover to their correct values.

Multi Variable Summary

As demonstrated by the examples above, there are only two cases where both the outputs Q and Q' suffer transients during the SEU and/or SET recovery time:

(a) when the logic block result signal f' assumes a false 0, while the state variable y1 assumes a false 0; and (b) when the state variable y1 assumes a false 0, while the state variable y2 assumes a false 1.

These two cases are considered to be so called "dual sensitive nodes" that illustrate the two vulnerable variables for the 0110 stable state: (a) result f' and node Y1; (b) node Y1 and node Y2. For the 0110 stable state, all other nodes are not considered to be dual sensitive nodes.

As mentioned above, the system 600, which has an exemplary logic block implementation of an X-OR function, has two stable states 0110 and 1001. The stable state 1001 has properties that are similar to the stable state 0110. Also described above, the stable state 0110 has two dual sensitive nodes. Hence, the stable state 1001 similarly has two dual sensitive nodes:

(c) when the result signal f assumes a false 0, while the state variable y2 assumes a false 0; and (d) when the state variable y1 assumes a false 1, while the state variable y2 assumes a false 0.

Accordingly, the system 600 that implements an X-OR function in its logic block 620, therefore has two stable states and only four dual sensitive nodes, two for each stable state. Moreover, some embodiments take particular care in the design of the physical layout of the system such that the four dual sensitive nodes are spaced sufficiently far apart so that a single particle strike does not perturb both of the dual sensitive nodes, for each of the two stable states. The system of these embodiments then has a very small SEU sensitive area. Moreover, in these embodiments no Single Event Upset, such as a particle strike, causes a transient simultaneously at both of the outputs Q and Q'.

VI. Alternative Embodiments

A. Fuller Strength PMOS Devices in the State Machine

Figure 10:
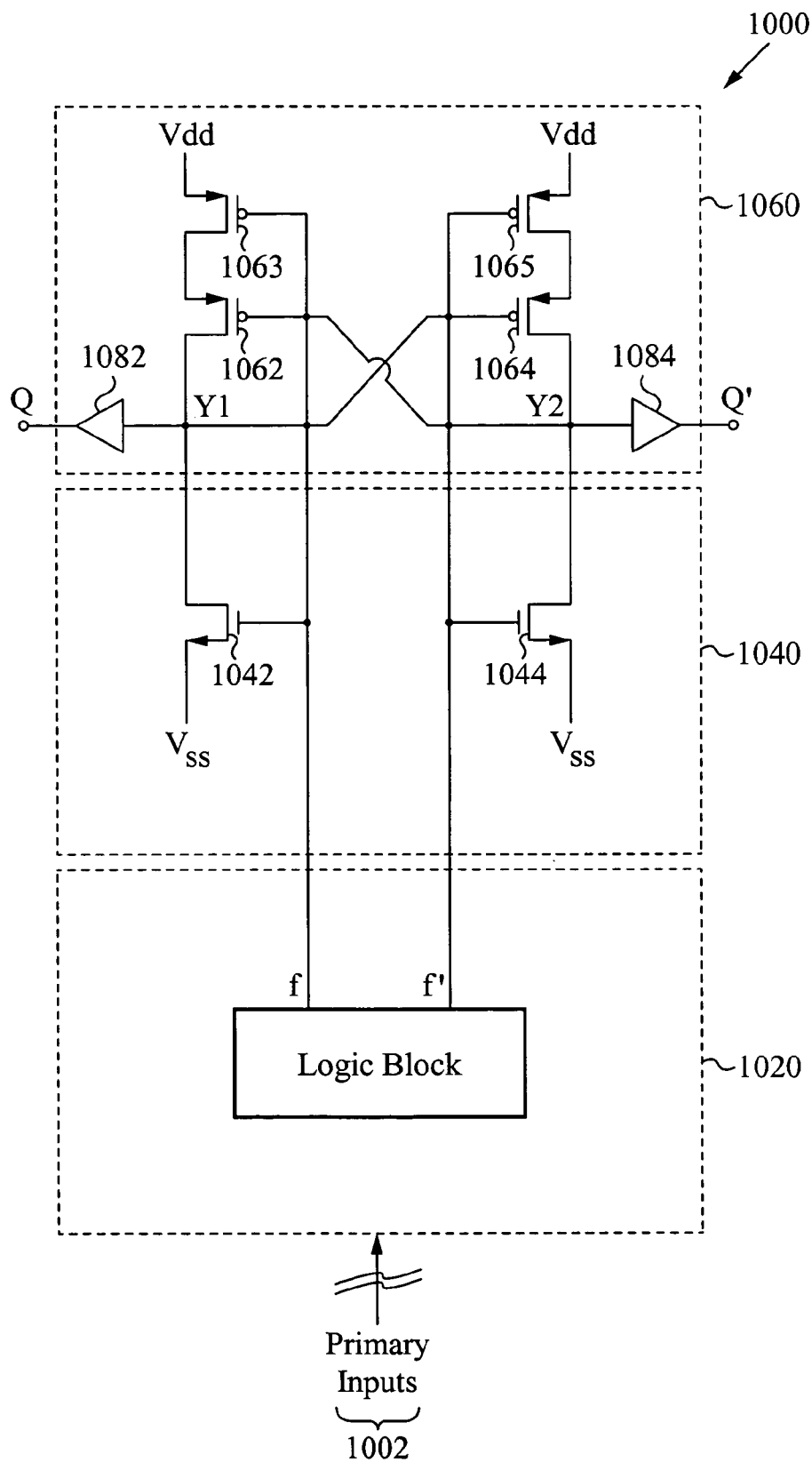
FIG. 10 illustrates an alternative embodiment having full strength state machine PMOS transistors.

One of ordinary skill will recognize a number of variations for the system 100 and 200 of FIGS. 1 and 2, respectively. For instance, FIG. 10 illustrates an alternative embodiment of a system 1000 that has higher strength PMOS devices for the state machine 1060. Specifically illustrated in this figure, the state machine 1060 has a set of four PMOS transistors 1062, 1063, 1064 and 1065, coupled into two corresponding pairs. The pairs are cross coupled. The function of each PMOS transistor pair 1062 and 1063, and 1064 and 1065, is as described above in relation to FIG. 2 (for the PMOS transistors 262 and 264). The advantage of the fuller strength PMOS devices (1062-1065) in the state machine 1060 is that the circuit action for the state machine 1060, and for the system 1000, may be faster. However, the disadvantage is that the total area of the system 1000 that is vulnerable to Single Event Upset is larger due to the larger physical area of the additional PMOS devices 1063 and 1065. In these embodiments, the conflicts described above in relation to FIG. 2, are resolved, or avoided, because the PMOS transistors (1062-1065) need not be weaker than the NMOS transistors (1042 and 1044).

B. Logic Block Having Only PMOS Devices

Figure 11:
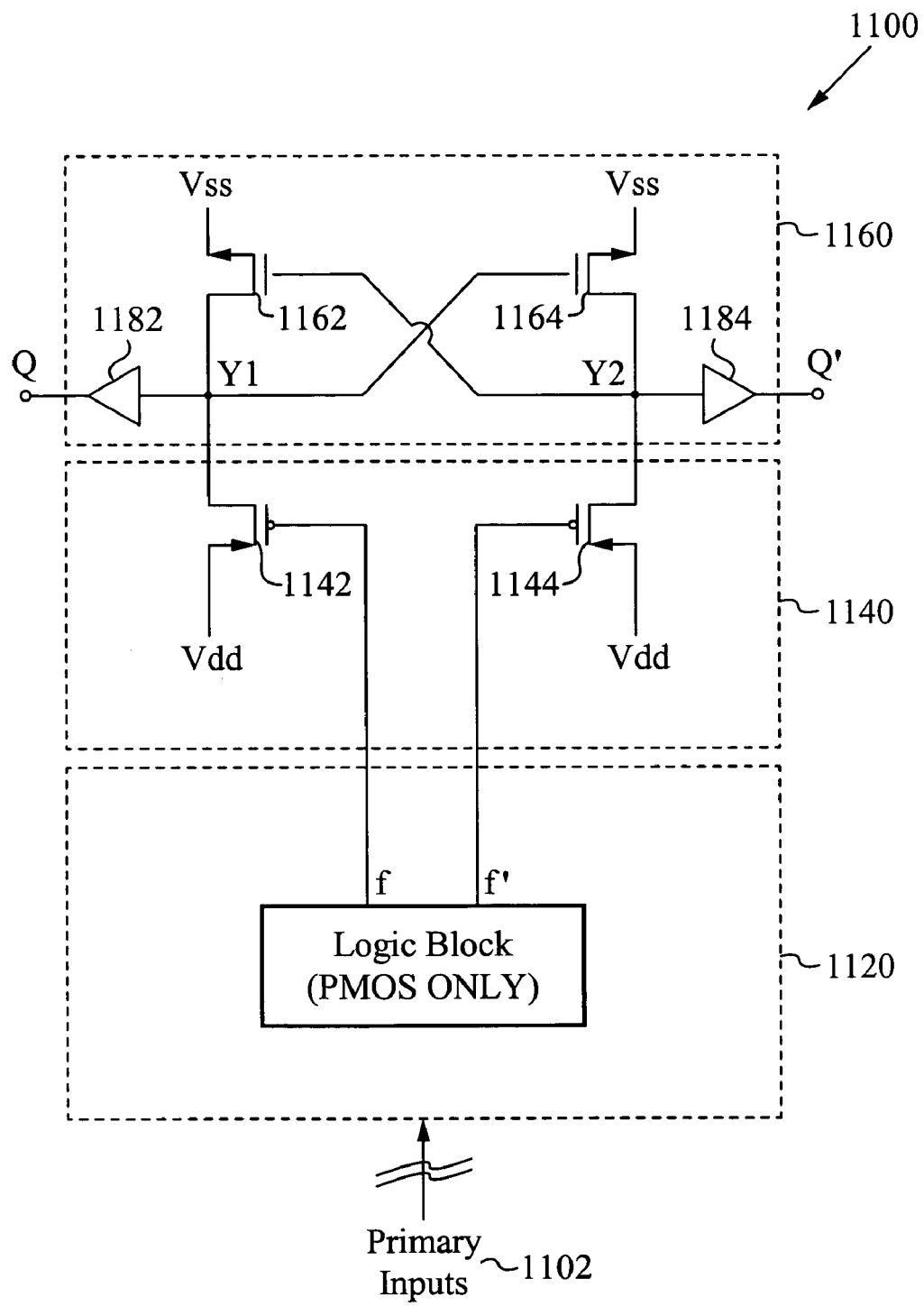
FIG. 11 illustrates an alternative embodiment using a PMOS only implementation of the logic block, PMOS pull up transistors for the bias stage, and NMOS transistors for the state machine.

In contrast to the embodiments described above that have a logic block formed by using only NMOS type devices, some embodiments have a logic block that is formed by using only PMOS type devices. In these embodiments, the diffusion physics of the PMOS transistors makes a false "0" impossible. Accordingly, the state table for the logic block is simplified as described above to eliminate impossible states and to resolve conflicts. FIG. 11 illustrates a system 1100 having a logic block 1120 in accordance with such an embodiment. As mentioned above, a (combinational) logic block having only PMOS type devices cannot produce a false 0 result.

As further shown in this figure, the logic block 1120 of some embodiments then drives PMOS "pull up" 1142 and 1144 devices in the bias stage 1140, rather than the NMOS "pull down" devices described above. The PMOS devices 1142 and 1144 are coupled to the level high voltage rail Vdd. The state machine 1160 has two cross coupled NMOS transistors 1162 and 1164 that are coupled to the level low voltage rail Vss. The drains of the cross coupled NMOS transistors 1162 and 1164, and the PMOS transistors 1142 and 1144, are coupled to form the storage nodes Y1 and Y2, and the buffered outputs Q and Q'. One of ordinary skill will recognize the variations between an NMOS and a PMOS implementation of the system 100 and 200, illustrated in FIGS. 1 and 2.

C. Method of Providing Error Tolerance

Figure 12:
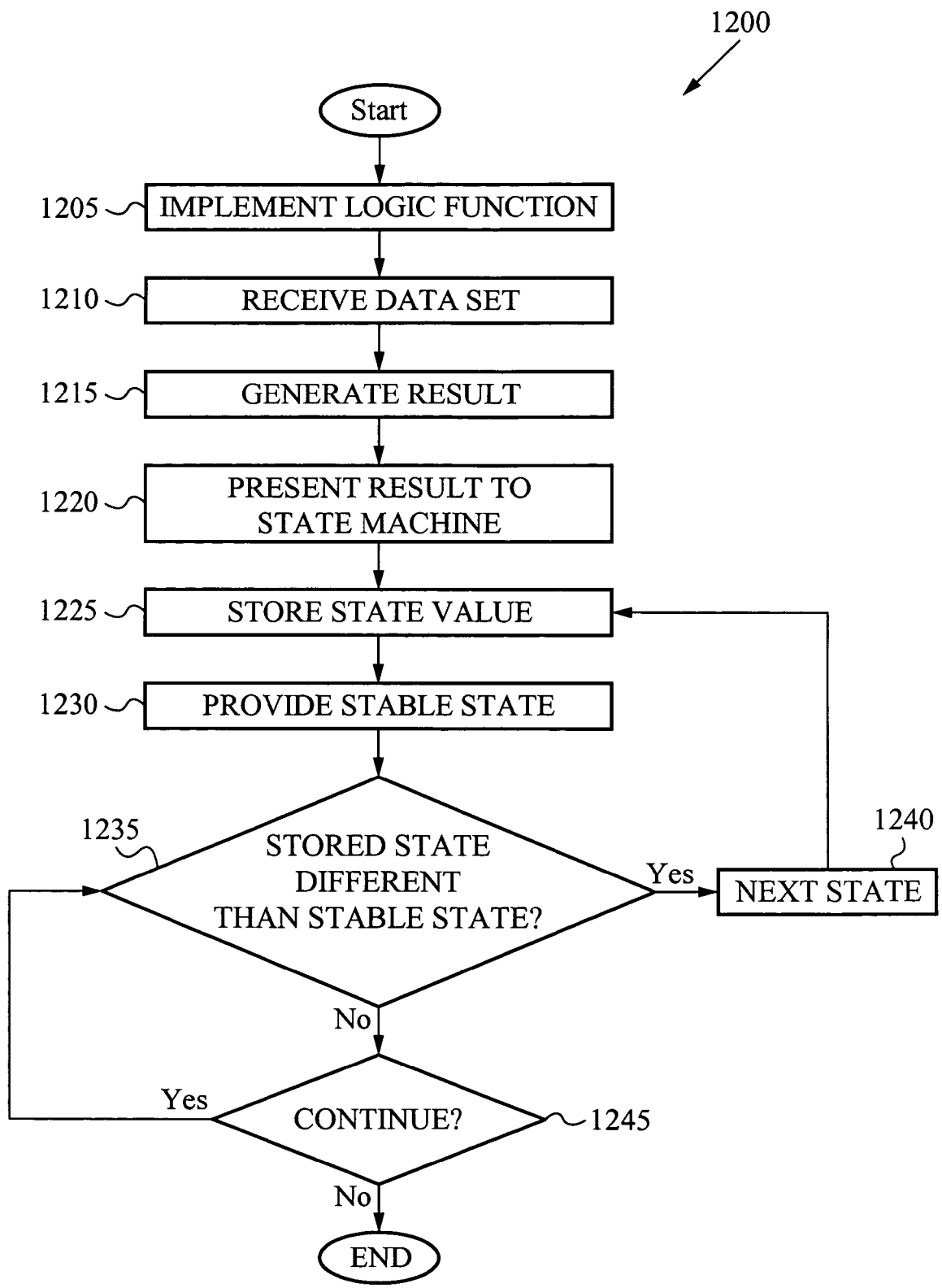
FIG. 12 illustrates a method of providing error tolerance.

FIG. 12 illustrates a method, the steps of which are performed by some embodiments, to provide error tolerance for a system. As shown in this figure, the method 1200 begins at the step 1205, where a logic function is implemented. The method 1200 then transitions to the step 1210, where the system receives a data set. The method 1200 then transitions to the step 1215, where a result f is generated by applying the data set to the logic function. Once a result is generated, the method transitions to the step 1220, where the result is presented to a state machine. Then, the method 1200 transitions to the step 1225, where a state value is stored by using the state machine. The state value is based on the result. Then, after the step 1225, the method 1200 transitions to the step 1230, where, by using the state machine, a stable state is provided. At the step 1235, the method determines whether the stored state value is different than the stable state. If the stored state value is different than the stable state, the method 1200 transitions to the step 1240. At the step 1240, the state machine assumes a next state selected from a set of predetermined states, and the process 1200 returns to the step 1225. If, at the step 1235, the stored state value is the same as the stable state, then the process transitions to the step 1245, where it is determined whether the process 1200 should continue. If the process 1200 should continue, the process 1200 returns to the step 1235, otherwise, the process 1200 concludes.

In some embodiments, the method further outputs the value stored by the state machine. The outputted value of some of these embodiments includes the stable state. Preferably, the step of transitioning to a next state provides, for the system, error tolerance. For instance, when an SEU temporarily alters the result, the step of transitioning returns the system to the stable state despite the altered result. Likewise, when an SEU temporarily alters the state value, the step of transitioning returns the system to the stable state despite the altered state value.

VII. Advantages

The various embodiments of the invention discussed above have a number of advantageous features over the art. For instance, much of the research in this area has focused on memory elements with single fault tolerant inputs intended to protect against SEU occurring internal to the memory storage cell. However, the effects of an SEU are not always localized to the storage cell. Specifically, transients, including Single Event Transients, are generated external to the storage cell, such as in the gates or other logic, but arrive at the storage cell coincident with a data latching clock event.

It is apparent to one skilled in the art that some embodiments are applied to the problem of a Single Event Transient arriving at a storage cell, or other sensitive node within a circuit, coincident with a data latching clock event. For example, the SEU tolerant system of some embodiments provides that any single upset at any single internal storage node is tolerated, and recoverable. Specifically, in these embodiments, one input is coupled to only one storage node and the same mechanism that recovers and/or corrects from a Single Event Upset at that particular storage node also corrects for a perturbed value that subsequently propagates through the circuit and is presented to a subsequent locus in the system.

Further, if a single input is connected to only one single storage node (having a state variable) then at least two redundant data sources are required to correctly write new data into the storage cell. Depending on the details of the particular system implementation, the redundant data input to [a node] D is preferably either of the form D* or of the form D', where D and D* have the same logic state, or alternatively, where D and D' have opposite logic states.

Moreover, researchers have examined the details of charge collection physics. See L. Rockett, Jr., *An SEU hardened CMOS data latch design,* IEEE Transactions on Nuclear Science, Vol. 35 No. 6, p. 1682-1687, December 1988. R. Velazco, D. Bessot, S. Duzellier, R. Ecoffet, and R. Koga, *Two CMOS memory cells suitable for the design of SEU-tolerant VLSI circuits,* IEEE Transactions on Nuclear Science, Vol. 41 No. 6, p. 2229-34, December 1994; U.S. Pat. No. 5,111,429, entitled "Single Event Upset Hardening CMOS Memory Circuit," issued May 5, 1992 to S. Whitaker; which are incorporated herein by reference. As described above, the internal storage nodes (state variables) of some embodiments are coupled to only a single transistor type, either NMOS or PMOS. These embodiments particularly implement the advantages of NMOS only or PMOS only architectures, such that the coupled nodes never suffer an internal upset in certain 0 to 1, or 1 to 0 directions. These embodiments advantageously forego the additional hardware and complexity of resolving such impossible upset conditions.

In some instances of the art, no advantage has been considered for storage nodes coupled with a logic block having only a single transistor type. These circuits require the additional hardware and implementation complexity necessary to enable all nodes in the circuit to be able to recover from upsets in both the 0 to 1 and the 1 to 0 directions (both false 1 and false 0). See e.g., T. Calin, M. Nicolaidis, and R. Velazco, *Upset hardened memory design for submicron CMOS* technology, IEEE Transactions on Nuclear Science, Vol. 43 No. 6, p. 2874-78, December 1996; U.S. Pat. No. 5,157,625, entitled "Radiation resistant SRAM memory," issued Oct. 20, 1992, to M. Barry; U.S. Pat. No. 5,311,070, entitled "SEU-immune latch for gate array, standard cell, and other ASIC applications," issued May 10, 1994, to J. Dooley; U.S. Pat. No. 6,573,773, entitled Conflict Free Radiation Tolerant Storage Cell, issued Jun. 3, 2003, to G. K. Maki, K. J. Hass, Q. Shi, and J. Murguia; which are incorporated herein by reference.

In another instance, an apparatus for and method of eliminating Single Event Upset in combinational logic which takes advantage of a memory cell structure that includes a single input fault tolerance characteristic and provides temporal data redundancy through use of a delay element is described in the U.S. Pat. No. 6,326,809 entitled "Apparatus for and Method of Eliminating Single Event Upsets in Combinational Logic," issued Dec. 04, 2001 to J. W. Gambles, et al., which is incorporated herein by reference. In contrast to the U.S. Pat. No. 6,326,809, some embodiments provide redundant outputs Q and Q' that are advantageously coupled to a SEU immune memory element with single input fault tolerance characteristic. These embodiments employ redundancy to eliminate the problem of a Single Event Transient arriving at an input to the memory element coincident with a latching clock event. Some embodiments of the invention further have an advantage over the U.S. Pat. No. 6,326,809 due to the delay element required therein. The delay element described in the U.S. Pat. No. 6,326,809 effectively increases the required data setup time to the memory element and thus slows the data throughput rate of that system.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A system comprising:
   a. an input;
   b. a logic block coupled to the input, the logic block for:
      i. implementing a logic function,
      ii. receiving a data set via the input, and
      iii. generating a result f by applying the data set to the logic function and a redundant set of devices for generating a complement f' of the result f;
   c. a bias stage coupled to the logic block, the bias stage for receiving the result;
   d. a state machine coupled to the bias stage, the state machine for receiving, via the bias stage, the result generated by the logic block, wherein the state machine is configured to retain a state value for the system; and
   e. an output coupled to the state machine, the output for providing the value stored by the state machine, wherein the stored value is based on the result.

2. The system of claim 1, wherein the logic block comprises combinational logic.

3. The system of claim 1, wherein the logic block comprises NMOS devices only, such that a Single Event Upset cannot produce a false 1.

4. The system of claim 1, wherein the logic block consists of PMOS devices only, such that a Single Event Upset cannot produce a false 0.

5. The system of claim 1, wherein the bias stage comprises a pull down network.

6. The system of claim 5, wherein the pull down network comprises a pair of NMOS devices with source leads coupled to a low voltage rail Vss, and with drain leads coupled to the state machine.

7. The system of claim 1, wherein the bias stage comprises a pull up network.

8. The system of claim 7, wherein the pull up network comprises a pair of PMOS devices with source leads coupled to a high voltage rail Vdd, and with drain leads coupled to the state machine.

9. The system of claim 1, wherein the state machine comprises a pair of cross coupled PMOS devices, wherein the source leads of the PMOS devices are coupled to a level high voltage rail Vdd, wherein the drain leads of the PMOS devices are coupled to the bias stage.

10. The system of claim 1, wherein the state machine comprises a pair of cross coupled NMOS devices, wherein the source leads of the NMOS devices are coupled to a level low voltage rail Vss, wherein the drain leads of the NMOS devices are coupled to the bias stage.

11. The system of claim 1, the state machine further comprising two pairs of PMOS devices that provide full strength P-type channels, such that an action of the state machine in response to the logic block is accelerated.

12. The system of claim 1, wherein the state machine retains the state value during a Single Event Upset condition.

13. The system of claim 1, wherein the state machine retains the state value when a node of the state machine has a high impedance.

14. The system of claim 1, wherein the state machine has a reduced area susceptible to Single Event Upset.

15. The system of claim 1, wherein the state machine comprises storage nodes Y1 and Y2, wherein the system tolerates Single Event Upset to one of the state machine nodes Y1 and Y2.

16. The system of claim 1, wherein the state machine comprises first and second nodes, the first node comprising a stored value and the second node comprising a complement of the stored value, wherein the first and second nodes are physically separated such that a single particle strike of the system affects only one of the stored value and the complement value.

17. The system of claim 16, wherein the particle strikes the state machine, the particle strike causing a Single Event Upset.

18. The system of claim 16, wherein the particle strikes the logic block, the particle strike causing a Single Event Transient, wherein the Single Event Transient is not propagated through the system.

19. The system of claim 1, wherein the output is buffered.

20. The system of claim 1, wherein the output comprises a pair of redundant values Q and its complement Q'.

21. The system of claim 20, wherein a Single Event Transient propagates to only one of the redundant values Q and Q'.

22. The system of claim 21, wherein the redundant values Q and Q' are redundantly coupled to a single input for a memory cell, wherein the memory cell is fault tolerant, wherein the memory cell is insulated from Single Event Upset by the system.

23. The system of claim 1, wherein the system tolerates a first Single Event Upset within the logic block and a second Single Event Upset within the state machine.

24. The system of claim 1, wherein the system tolerates multiple upsets within the logic block.

25. The system of claim 1, wherein the system tolerates multiple upsets within the logic block and one SEU event within the state machine.

26. The system of claim 1, wherein a plurality of SEU sensitive nodes are separated within the system such that a single particle strike affects only one of the SEU sensitive nodes.

27. A method of providing error tolerance for a system, the method comprising:
   a. implementing a logic function;
   b. receiving a data set;
   c. generating a result f and a result f' by applying the data set to the logic function;
   d. presenting the result to a state machine;
   e. storing a state value for the system by using the state machine, wherein the state value is based on the result; and
   f. providing, by using the state machine, a stable state, wherein when the stored state value is different than the stable state, the state machine further performing the step of transitioning to a next state selected from a set of predetermined states.

28. The method of claim 27, further comprising: outputting the value stored by the state machine.

29. The method of claim 28, wherein the outputted value comprises the stable state.

30. The method of claim 27, wherein the step of transitioning to a next state provides, for the system, the error tolerance.

31. The method of claim 27, wherein an SEU temporarily alters the result, such that the step of transitioning returns the system to the stable state despite the altered result.

32. The method of claim 27, wherein an SEU temporarily alters the state value, such that the step of transitioning returns the system to the stable state despite the altered state value.

* * * * *

UNITED STATES PATENT AND TRADEMARK OFFICE
CERTIFICATE OF CORRECTION

| | | |
|---|---|---|
| PATENT NO. | : 7,489,538 B2 | Page 1 of 1 |
| APPLICATION NO. | : 11/527375 | |
| DATED | : February 10, 2009 | |
| INVENTOR(S) | : Gary K. Maki et al. | |

It is certified that error appears in the above-identified patent and that said Letters Patent is hereby corrected as shown below:

ON THE TITLE PAGE

At item "(75) Inventors," please replace the first named inventor, "Gary R. Maki, Post Falls, ID" with "Gary K. Maki, Coeur D'Alene, ID" so that the first line reads:

Item -- (75) Inventors:   Gary K. Maki, Coeur D'Alene, ID (US); --

Signed and Sealed this

Thirty-first Day of March, 2009

JOHN DOLL
*Acting Director of the United States Patent and Trademark Office*